US009547181B2

(12) United States Patent
Yang et al.

(10) Patent No.: US 9,547,181 B2
(45) Date of Patent: Jan. 17, 2017

(54) DIFFRACTIVE OPTICAL ELEMENT, DESIGN METHOD THEREOF AND APPLICATION THEREOF TO SOLAR CELL

(71) Applicant: INSTITUTE OF PHYSICS, CHINESE ACADEMY OF SCIENCES, Beijing (CN)

(72) Inventors: Guozhen Yang, Beijing (CN); Bizhen Dong, Beijing (CN); Yan Zhang, Beijing (CN); Jiasheng Ye, Beijing (CN); Qingbo Meng, Beijing (CN); Qingli Huang, Beijing (CN); Jinze Wang, Beijing (CN)

(73) Assignee: INSTITUTE OF PHYSICS, CHINESE ACADEMY OF SCIENCES, Beijing (CN)

( * ) Notice: Subject to any disclaimer, the term of this patent is extended or adjusted under 35 U.S.C. 154(b) by 267 days.

(21) Appl. No.: 14/355,939

(22) PCT Filed: Nov. 8, 2012

(86) PCT No.: PCT/CN2012/084346
§ 371 (c)(1),
(2) Date: May 2, 2014

(87) PCT Pub. No.: WO2013/067955
PCT Pub. Date: May 16, 2013

(65) Prior Publication Data
US 2014/0293422 A1      Oct. 2, 2014

(30) Foreign Application Priority Data

Nov. 9, 2011   (CN) .......................... 2011 1 0351978

(51) Int. Cl.
*G02B 5/18*       (2006.01)
*G02B 27/42*      (2006.01)
(Continued)

(52) U.S. Cl.
CPC ....... *G02B 27/4222* (2013.01); *G02B 19/0042* (2013.01); *G02B 27/0012* (2013.01);
(Continued)

(58) Field of Classification Search
CPC ............ G02B 27/4244; G02B 19/0042; G02B 27/0012; G02B 27/1086; G02B 5/18; G02B 5/32; G02B 6/29311; G02B 2006/12107
(Continued)

(56) References Cited

U.S. PATENT DOCUMENTS

| 4,204,881 A | 5/1980 | McGrew |
| 2004/0150887 A1* | 8/2004 | Hirai .................... G02B 27/09 359/626 |

(Continued)

FOREIGN PATENT DOCUMENTS

| CN | 1800939 | 7/2006 |
| CN | 102187473 | 9/2011 |

(Continued)

OTHER PUBLICATIONS

International Search Report dated Feb. 14, 2013 issued in corresponding PCT Application No. PCT/CN2012/084346 [with English Translation].

(Continued)

*Primary Examiner* — Ricky Mack
*Assistant Examiner* — Daniele Manikeu
(74) *Attorney, Agent, or Firm* — Andrews Kurth Kenyon LLP

(57) ABSTRACT

Disclosed are a diffractive optical element, a design method thereof and the application thereof in a solar cell. The design method for a design modulation thickness of a sampling point of the diffractive optical element comprises: calculating the modulation thickness of the current sampling point for each wavelength component; obtaining a series of alter- (Continued)

native modulation thicknesses which are mutually equivalent for each modulation thickness, wherein a difference between the corresponding modulation phases is an integral multiple of $2\pi$; and selecting one modulation thickness from the alternative modulation thicknesses of each wavelength to determine the design modulation thickness of the current sampling point. In an embodiment, the design method introduces a thickness optimization algorithm into a Yang-Gu algorithm. The design method breaks through limitations to the modulation thicknesses/modulation phases in the prior art and increases the diffraction efficiency, and the obtained diffractive optical element facilitates mass production by a modern photolithographic technique, which greatly reduces the cost. The diffractive optical element may also be applied to the solar cell, which provides an efficient and low-cost way for solar energy utilization.

12 Claims, 3 Drawing Sheets

(51) Int. Cl.
   *G06F 17/50*   (2006.01)
   *H01L 31/054*  (2014.01)
   *G02B 19/00*   (2006.01)
   *G02B 27/10*   (2006.01)
   *G02B 27/00*   (2006.01)

(52) U.S. Cl.
   CPC ..... *G02B 27/1086* (2013.01); *G02B 27/4244* (2013.01); *G06F 17/50* (2013.01); *H01L 31/0549* (2014.12); *G02B 5/18* (2013.01); *Y02E 10/52* (2013.01)

(58) Field of Classification Search
   USPC ...... 359/11, 558–569, 204.5; 355/30, 67, 77
   See application file for complete search history.

(56) References Cited

U.S. PATENT DOCUMENTS

| | | | |
|---|---|---|---|
| 2005/0207012 A1* | 9/2005 | Arnold | G02B 5/18 359/571 |
| 2005/0238285 A1* | 10/2005 | Takushima | G02B 6/29311 385/24 |
| 2006/0193556 A1* | 8/2006 | Frisken | G02B 6/29311 385/27 |
| 2007/0019313 A1* | 1/2007 | Mugnier | G02B 6/02109 359/884 |
| 2008/0037125 A1* | 2/2008 | Takamiya | G02B 5/1871 359/568 |
| 2011/0038037 A1* | 2/2011 | Canova | G02B 27/58 359/345 |

FOREIGN PATENT DOCUMENTS

| | | |
|---|---|---|
| CN | 102375171 | 3/2012 |
| CN | 202305859 | 7/2012 |
| KR | 10-0966371 | 6/2010 |

OTHER PUBLICATIONS

Gu, Ben-Yuan et al., "Diffractive-phase-element design that implements several optical functions", Applied Optics, May 10, 1995, vol. 34, No. 14, pp. 2564-2570, ISSN 1559-128X.

Yang, Guozhen et al., "Design method of diffractive optical element", Physics, 1994, vol. 23, No. 4, pp. 200-205, ISSN 0379-4148.

Yang, Guozhen, et al., "Iterative optimization approach for the design of diffractive phase elements simultaneously implementing several optical functions," J. Opt. Soc. Am. A, May 1994, vol. 11, pp. 1632-1640.

Dong, Bi-Zhen et al., "Design and fabrication of a diffractive phase element for wavelength demultiplexing and spatial focusing simultaneously," Appl. Opt., Dec. 10, 1996, vol. 35, pp. 6859-6864.

Dong, Bi-Zhen et al., "Diffractive phase elements that implement wavelength demultiplexing and spatial annular focusing simultaneously," J. Opt. Soc. Am. A, Jan. 1997, vol. 14, pp. 44-48.

Dong, Bi-Zhen et al., "Design of diffractive phase elements that generate monochromatic or color point ad ring patterns," J. Opt. Soc. Am. A, Feb. 1998, vol. 15, pp. 480-486.

Yang, Guozhen et al., "Gerchberg-Saxton and Yang-Gu algorithms for phase retrieval in a nonunitary transform system: a comparison," Appl. Opt. 32, Jan. 10, 1994, pp. 209-218.

* cited by examiner

DIFFRACTIVE OPTICAL ELEMENT, DESIGN METHOD THEREOF AND APPLICATION THEREOF TO SOLAR CELL

This application is a national stage application of International Application No. PCT/CN2012/084346, filed Nov. 8, 2012, which claims priority to Chinese Application No. 201110351978.9, filed Nov. 9, 2011, each of which is incorporated by reference in its entirety.

FIELD OF THE INVENTION

The present invention relates to the field of optics, and more specifically to a diffractive optical element, a design method thereof and application thereof to solar cell.

BACKGROUND OF THE INVENTION

A diffractive optical element (DOE) is an optical element performing optical functions of such as focusing, color-separation (wavelength demultiplexing), refraction, reflection and imaging based on the optical diffraction principle. A typical diffractive optical element has a micro surface-relief profile which enables the phase of an incident light beam through the diffractive optical element to change (namely, phase modulation) so as to obtain a desired or designated output light distribution. A modulation amount of the phase of the incident light beam caused by the micro-relief profile on the surface of the diffractive optical element is related to its thickness, that is, modulation thickness. Therefore, a core issue in designing the diffractive optical element is to determine a modulation thickness at each position (sampling point) of its surface.

There are many documents studying the design of the diffractive optical element. For example, references are listed in the following:

[1] G. Z. Yang, B. Y. Gu, et al."Iterative optimization approach for the design of diffractive phase elements simultaneously implementing several optical functions,"J. Opt. Soc. Am. A Vol. 11, 1632-1640 (1994).

[2] B. Z. Dong, G. Q. Zhang, G. Z. Yang, B. Y. Gu, et al. "Design and fabrication of a diffractive phase element for wavelength demultiplexing and spatial focusing simultaneously," Appl. Opt. Vol. 35, 6859-6864 (1996).

[3] B. Z. Dong, G. Z. Yang, B. Y. Gu, et al. "Diffractive phase elements that implement wavelength demultiplexing and spatial annular focusing simultaneously," J. Opt. Soc. Am. A Vol. 14, 44-48 (1997).

[4] B. Z. Dong, R. Liu, G. Z. Yang and B. Y. Gu, "Design of diffractive phase elements that generate monochromatic or color point ad ring patterns," J. Opt. Soc. Am. A Vol. 15, 480-486 (1998).

[5] B. Y. Gu, G. Z. Yang, B. Z. Dong, et al., "Diffractive-phase-element design that implements several optical functions,"Appl. Opt. 34, 2564-2570 (1995).

[6] G. Z. Yang, B. Z. Dong, B. Y. Gu, et al., "Gerchberg-Saxton and Yang-Gu algorithms for phase retrieval in a nonunitary transform system: a comparison,"Appl. Opt. 32, 209-218 (1994).

In the above-listed and other unlisted relevant references, Yang-Gu algorithm is adopted to solve a phase modulation amount for the incident light beam or the modulation thickness of the diffractive optical element, and both color-separating and focusing functions for the incident light beam having a plurality of wavelength components can be achieved simultaneously by means of a single diffractive optical element. However, the diffractive optical element designed according to the existing methods only has a diffraction efficiency of 10%-20%, thereby the diffractive optical element is limited in certain applications. It should be noted that the diffraction efficiency of the diffractive optical element here refers to a proportion of energy of output light in a focus area to incident light energy.

Another aspect involved in the present application is related to solar cells. Energy issue is an important topic of common concern for all countries in today's world, and pollution-free solar energy is a strategic resource which all countries are striving to utilize. A solar cell is a device converting solar energy to electrical energy. A basic principle of solar cells goes as follows: when sunlight irradiates photovoltaic materials in the solar cell, e.g., semiconductor materials, the semiconductor materials convert light energy into electrical energy because of a photovoltaic effect after absorbing the sunlight irradiation. Since different semiconductor materials have different bandgap structures, a semiconductor material can have a higher photoelectric conversion efficiency only around a respective wavelength component of the incident light beam corresponding to the bandgap energy thereof. Provided that semiconductors having different bandgaps can be used to absorb light around respective wavelength components corresponding to the bandgap energies, this will substantially improve the photoelectric conversion efficiency of solar energy. Studies also indicate that if sunlight is focused, the conversion efficiency of solar energy will not deteriorate due to the increase of light intensity, but improve to some extent. In the case that the sunlight is focused, a lot of expensive materials may be saved, and a less cell area may be used to convert more light energy.

In view of the above idea of utilizing solar energy, currently there are chiefly two classes of study schemes for solar cells in the world, namely, series (also known as "cascading") or parallel (also known as "lateral") mode. In the "series" configuration, different semiconductor materials grow in turn from down to up in a vertical direction and their bandgap energies increases gradually. An incident light beam, after being focused by an optical system, passes through all layers of materials. A shortest wavelength component (with a maximum energy) in the incident light beam is absorbed by the uppermost layer of semiconductor material. Along with the increase of the wavelength, the incident light beam is absorbed in turn by the lower layers of semiconductor materials. As such, a higher conversion efficiency can be achieved. A drawback of this scheme lies in that an interface between different layers of semiconductors needs to grow by virtue of technologies such as molecular beam epitaxy, which is very difficult to be controlled precisely and has great limitation of choices of materials so as to cause the manufacture cost very high. The parallel configuration refers to performing the color-separation while focusing the sunlight, so that sunlight having different wavelength components is focused to different positions, each of which a semiconductor material with a bandgap energy approximate to photon energy of the corresponding wavelength component is placed at, thereby substantially improving the photoelectric conversion efficiency of the solar energy. Currently, there are mainly two existing schemes for achieving the parallel configuration. The first scheme is to perform color-separation for the sunlight by means of a dichroic mirror so as to separate the sunlight into two waveband components, a longwave component and a shortwave component. To achieve a higher efficiency of the color-separation, the dichroic mirror usually needs to be coated with more than ten layers or even dozes of layers of films, which is technically very difficult. The second scheme is to use a lens-prism combination to perform color-separation, and this scheme makes the optical device bulky. A drawback of the existing parallel configurations lies in that the cost of the optical system is very high.

If the thickness of a diffractive optical element can be controlled within a certain range, it may be fabricated and copied in batches by modern photolithography technology so that the cost of the optical system may be greatly reduced. If the diffractive optical element has functions of color-separating and focusing, the cost of the whole color-separating and focusing photovoltaic system may be substantially cut.

However, as stated in the above description of the diffractive optical element, a diffraction efficiency of the current diffractive optical element for color-separating and focusing is only 10%-20%, such diffraction efficiency is obviously not high enough to utilization of the solar energy and hinders application of the color-separating and focusing diffractive optical element to the solar cell.

SUMMARY OF THE INVENTION

An object of the present invention lies in optimizing the design of the diffractive optical element so that the modulation thickness of the diffractive optical element may be determined more flexibly. Another object of the present invention lies in optimizing the design of the diffractive optical element to improve the diffraction efficiency of the diffractive optical element. A further object of the present invention is to provide a solar cell to which the diffractive optical element is applied.

According to one aspect of the present invention, there is provided a design method of a diffractive optical element for obtaining design modulation thicknesses at a plurality of sampling points of the diffractive optical element. The diffractive optical element may be disposed at an input plane of an optical system and configured to modulate phase of an incident light beam having a plurality of wavelength components so as to obtain a desired optical distribution on an output plane.

For each sampling point of the diffractive optical element, the design method comprises:

Step 1: calculating a modulation thickness for each wavelength component at a current sampling point of the diffractive optical element, and accordingly obtaining a respective plurality of modulation thicknesses corresponding to the plurality of wavelength components;

Step 2: obtaining a series of mutually-equivalent alternative modulation thicknesses for each modulation thickness, the series of mutually-equivalent alternative modulation thicknesses being corresponding to a respective series of modulation phases mutually different by an integer multiple of $2\pi$; and Step 3: selecting a modulation thickness from the alternative modulation thicknesses of each wavelength component, and determining a design modulation thickness of the current sampling point based on a respective plurality of selected modulation thicknesses corresponding to the plurality of wavelength components.

In an embodiment, in Step 1 the modulation thickness may be calculated by using Yang-Gu algorithm. The Yang-Gu algorithm may comprise an iterative cycle consisting of multiple iterations, and the modulation thickness in the current iteration can be obtained during each iteration. Step 2 and step 3 may be performed for the modulation thickness obtained in the current iteration. A final modulation thickness can be obtained at the end of the iteration cycle of the Yang-Gu algorithm, and then step 2 and step 3 are performed for the final modulation thickness.

In one embodiment, a modulation phase corresponding to the modulation thickness in step 1 is less than $2\pi$.

In an embodiment, in step 2 a maximum value of the alternative modulation thicknesses may be constrained according to a limitation of a fabricating process for the diffractive optical element. Here, the limitation of the fabricating process may be a maximum etching depth of a photolithography process.

In an embodiment, in step 3 a criterion for the selecting may be to make the differences between the plurality of selected modulation thicknesses as small as possible, or to make the plurality of selected modulation thicknesses have a minimum error as compared with the design modulation thickness determined by the plurality of selected modulation thicknesses.

In an embodiment, the desired optical distribution comprises an optical distribution of color-separating and focusing the wavelength components of the incident light beam on the output plane.

In an embodiment, the design modulation thickness at at least one sampling point of the diffractive optical element enables the sampling point to modulate the phase of each wavelength component of the plurality of wavelength components with a modulation amount of greater than $2\pi$.

According to another aspect of the present invention, there is provided a diffractive optical element designed according to the aforesaid method.

The diffractive optical element may be fabricated by photolithography process. The photolithography process here for example means directly employing photolithography technology to fabricate the diffractive optical element, or processing a master plate by using modern photolithography technology and then using imprinting technique for mass production.

According to a further aspect of the present invention, there is provided a diffractive optical element disposed at an input plane of an optical system and configured to modulate phase of an incident light beam having a plurality of wavelength components so as to obtain a desired optical distribution on an output plane. A design modulation thickness at at least one sampling point of the diffractive optical element enables the sampling point to modulate the phase of each wavelength component of the plurality of wavelength components with a modulation amount of greater than $2\pi$.

In an embodiment, the desired optical distribution comprises an optical distribution of color-separating and focusing the wavelength components of the incident light beam on the output plane.

In an embodiment, the photolithography process here for example means directly employing photolithography technology to fabricate the diffractive optical element, or processing a master plate by using modern photolithography technology and then using imprinting technique for mass production.

According to a further aspect of the present invention, there is provided a solar cell, comprising:

a single diffractive optical element configured to color-separate and focus a plurality of selected wavelength components of an incident sunlight beam on an output plane; and a respective plurality of kinds of semiconductor materials corresponding to the plurality of selected wavelength components, each of which is disposed at a focusing area of the corresponding wavelength component on the output plane for absorbing the sunlight around the corresponding wavelength component.

In an embodiment, the single diffractive optical element of the solar cell is any one of the aforesaid diffractive optical element.

The present invention has the following advantageous effects:

1) The diffractive optical element and its design method according to the present invention break through limitations to the modulation thicknesses/modulation phases in the prior art so that the modulation thickness of the diffractive optical element can be selected from a larger range, thereby improving flexibility in selecting the modulation thickness of the diffractive optical element.

2) Since the modulation thickness of the diffractive optical element according to the present invention can be selected from a larger range, the thickness of the diffractive optical element can be controlled arbitrarily according to actual needs and controlled within a certain range, thereby facilitating processing a master plate by using modern photolithography technology and then using imprinting technique for mass production and thereby substantially reducing the cost.

3) Since the modulation thickness of the diffractive optical element according to the present invention can be selected from a larger range, a design modulation thickness better than the prior art can be found in an expanded selection range, thereby greatly enhancing the diffraction efficiency of the diffractive optical element. The theoretical diffraction efficiency of the diffractive optical element for performing color-separating and focusing simultaneously according to the present invention exceeds 79%.

4) Since the diffractive optical element according to the present invention greatly enhances the diffraction efficiency of the diffractive optical element, the color-separating and focusing diffractive optical element has practical application significance in solar cells. In combination with mass production through a modern lithographic technique as previously stated, this provides an efficient and low-cost way for solar energy utilization.

DETAILED DESCRIPTION OF EMBODIMENTS

Figure 1:
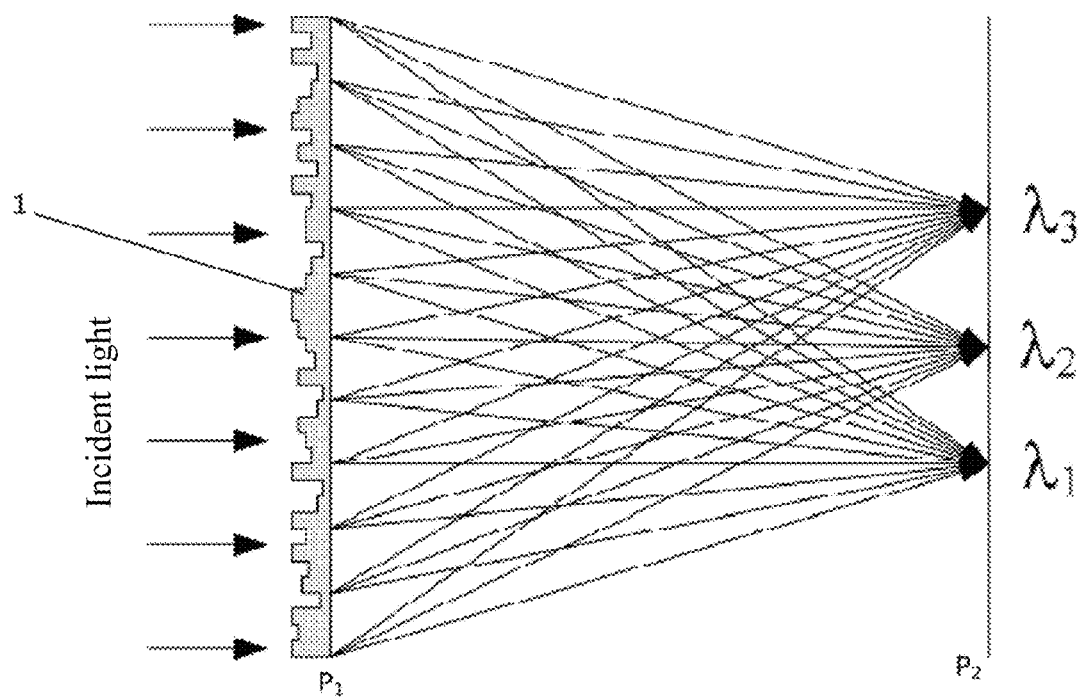
FIG. 1 shows an illustrative optical system, wherein a diffractive optical element performs color-separating and focusing functions for the incident light beam simultaneously.

Design Ideas of a Diffractive Optical Element According to the Present Invention As shown in the illustrative optical system of FIG. 1, an incident light beam having a plurality of wavelength components $\lambda_\alpha$ propagates from an input plane $P_1$ to an output plane $P_2$ wherein $\alpha=1, 2, 3, \ldots N_\lambda$. $N_\lambda$ represents the number of different wavelengths, and $N_\lambda$ is exemplarily equal to 3 in FIG. 1. The diffractive optical element 1 is adhered to the input plane P1 to modulate the phase of the incident light beam so as to obtain output light on the output plane P2, where the plurality of wavelength components are color-separated and focused. In FIG. 1, locations of $\lambda_1$, $\lambda_2$ and $\lambda_3$ respectively represent focusing positions or areas where light wave of the corresponding wavelength components are respectively focused on the output plane P2.

Regarding the wavelength $\lambda_\alpha$, its incident light wave is modulated by the diffractive optical element 1, and then has an input wave function denoted by $U_{1\alpha}$ on the input plane P1 and has an output wave function denoted by $U_{2\alpha}$ on the output plane P2. The wave functions are generally complex, so $U_{1\alpha}$ and $U_{2\alpha}$ may be respectively expressed as:

$$U_{1\alpha}=\rho_{1\alpha}\exp[i\Phi_{1\alpha}] \quad (1)$$

$$U_{2\alpha}=\rho_{2\alpha}\exp[i\Phi_{2\alpha}] \quad (2)$$

wherein $\rho_{1\alpha}$ and $\Phi_{1\alpha}$ are respectively an amplitude and a phase of the input wave function $U_{1\alpha}$, and $\rho_{2\alpha}$ and $\Phi_{2\alpha}$ are respectively an amplitude and a phase of the output wave function $U_{2\alpha}$.

Relationship between the output wave function $U_{2\alpha}$ and the input wave function $U_{1\alpha}$ may be expressed as:

$$U_{2\alpha}=\hat{G}_\alpha U_{1\alpha} \quad (3)$$

wherein the operator $\hat{G}_\alpha$ represents a propagation operator indicating light wave propagates from the input plane to the output plane. For example, when it is a free space between the input plane and the output plane, $\hat{G}_\alpha$ represents free propagation effect of light wave; when there are other optical elements between the input plane and the output plane, $\hat{G}_\alpha$ also contains optical effects of these optical elements.

On an occasion of using the diffractive optical element to perform phase modulation for the incident light beam in order to obtain the required output light, the amplitude $\rho_1$ of the input wave function $U_{1\alpha}$ and the amplitude $\rho_2$ of the output wave function $U_{2\alpha}$ may be considered as having been known. The propagation operator $\hat{G}_\alpha$ is also known for a definite optical system. Therefore, for such an occasion, the designing of the diffractive optical element DOE is in fact how to solve the phase $\Phi_{1\alpha}$ of $U_{1\alpha}$ in the case that $p_1$, $p_2$ and $\hat{G}_\alpha$ are known. When we suppose that the incident light beam have the same phase before modulation by the diffractive optical element, the phase $\Phi_{1\alpha}$ will represent the modulation phase of the diffractive optical element and thus the modulation thickness of the diffractive optical element may be calculated.

To solve the phase $\Phi_{1\alpha}$, a distance D is introduced in the Yang-Gu algorithm and defined as:

$$D^2=\|U_{2\alpha}^0-\hat{G}_\alpha U_{1\alpha}\|^2 \quad (4)$$

wherein, the operator $\|\ldots\|$ represents obtaining the modulus of a complex number, and represents a target amplitude on the output plane. $U_{2\alpha}^0=\rho_{2\alpha}^0\exp(i\Phi_{2\alpha})$, $\rho_{2\alpha}^0$ represents a target amplitude on the output plane.

Regarding the formula (4), when requesting that $\delta_{\Phi 1\alpha}D^2=0$ and $\delta_{\Phi 2\alpha}D^2=0$, the following may be obtained:

$$\Phi_{2\alpha}=\arg[\hat{G}_\alpha\rho_{1\alpha}\exp[i\Phi_{1\alpha}] \quad (5)$$

$$\Phi_{1\alpha}=\arg\{\hat{A}_{\alpha D}^{-D}[\hat{G}_\alpha^+\rho_{2\alpha}^0\exp(i\Phi_{2\alpha})-\hat{A}_{\alpha ND}\rho_{1\alpha}\exp(i\Phi_{1\alpha})]\} \quad (6)$$

wherein, $\hat{A}_\alpha=\hat{G}_\alpha^+\hat{G}_\alpha$ is a product of $\hat{G}_\alpha^+$ and $\hat{G}_\alpha$, $\hat{G}_\alpha^+$ represents the conjugate transpose of $\hat{G}_\alpha$; $\hat{A}_{\alpha D}$ represents a matrix formed by diagonal elements in matrix $\hat{A}_\alpha$, $\hat{A}_{\alpha ND}$ represents a matrix formed by non-diagonal elements in matrix $\hat{A}_\alpha$; arg represents solving the argument of a complex number, namely, solving the phase of the complex amplitude here. The modulation phase $\Phi_{1\alpha}$ may be solved according to the formulas (5) and (6) by numerical iteration operation.

According to relationship between the modulation phase and the modulation thickness of the diffractive optical element:

$$\Phi_{1\alpha} = 2\pi(n_\alpha - 1)h_{1\alpha}/\lambda_\alpha \qquad (7)$$

the modulation thickness $h_{1\alpha}$ may be obtained according to the solved modulation phase $\Phi_{1\alpha}$, wherein $n_\alpha$ is a refractive index of the diffractive optical element corresponding to the wavelength of $\lambda_\alpha$.

As such, by means of the above calculations, a corresponding modulation thickness $h_{1\alpha}$ may be solved for each wavelength $\lambda_\alpha$ of $N_\lambda$ different wavelengths.

In actual design of the diffractive optical element, to facilitate calculation, a plurality of sampling points are set at the diffractive optical element, and the modulation thickness $h_{1\alpha}$ thereof is calculated for each sampling point. In this way, $h_{1\alpha}$ with a total number of $N_\lambda$ corresponding to $N_\lambda$ wavelengths may be obtained for a specific sampling point, wherein $\alpha = 1, 2, 3, \ldots, N_\lambda$.

Obviously, there can be only one thickness for each sampling point for the finally-designed diffractive optical element. Therefore, one final design modulation thickness $h_1$ needs to be determined according to the obtained $N_\lambda$ modulation thicknesses $h_{1\alpha}$. Apparently, it is desirable that the final design modulation thickness $h_1$ is generally approximate to each design modulation thickness $h_{1\alpha}$. Usually, an intermediate value or an average value of the calculated $N_\lambda$ modulation thicknesses $h_{1\alpha}$ is taken as the final design modulation thickness $h_1$.

It should be pointed out that the above method substantially describes a method of obtaining the design modulation thickness of the diffractive optical element by Yang-Gu algorithm in the prior art.

However, as stated in the Background of the Invention, a very high signal-to-noise ratio can be obtained when the diffractive optical element obtained by such a method is used for the color-separating and focusing of the multi-wavelength incident light beam, but an overall diffraction efficiency is very low, only up to 10%-20%.

The Inventors of the present application finds out that at least one reason for the lower diffraction efficiency is that the final design modulation thickness $h_1$ determined by $N_\lambda$ modulation thicknesses $h_{1\alpha}$ in the prior art is not ideal enough yet. During actual numerical calculation, upon processing the formula (6), arg operation will cause $\Phi_{1\alpha}$ to be in a range of $0 \leq \Phi_{1\alpha} < 2\pi$. As known from the formula (7), this is equivalent to limiting the range of the modulation thickness $h_{1\alpha}$ to a range $0 \leq h_{1\alpha} < \lambda_\alpha/(n_\alpha - 1)$. In fact, when $\Phi_{1\alpha}$ takes values different by an integer multiple of $2\pi$, namely, $\Phi_{1\alpha}' = \Phi_{1\alpha} + 2K\pi (K=0,1,2,3,\ldots)$, i.e., the modulation thickness takes the following values, $$h_{1\alpha}'= h_{1\alpha} + K \Delta h_{1\alpha}, \text{ wherein } K=0,1,2,3,\ldots, \Delta h_{1\alpha} = \lambda_\alpha/(n_\alpha-1) \qquad (8)$$

phase modulations performed by them to the incident light beam are equivalent to each other.

The Inventors also finds out that a more desirable design modulation thickness $h_1$ might be obtained by regarding each of a series of equivalent modulation thicknesses listed in the formula (8) as an alternative modulation thickness of $h_{1\alpha}$. Illustration is presented by taking a simple incident light beam with two different wavelength components $\lambda_1$ and $\lambda_2$ as an example. At a certain sampling point of the diffractive optical element, when the method in the prior art is employed, the modulation thickness corresponding to the wavelength $\lambda_1$ is $h_{11}$, the modulation thickness corresponding to the wavelength $\lambda_2$ is $h_{12}$, and $h_{11} < h_{12}$, then the final design modulation thickness may be an average value of the two modulation thicknesses $h_1(h_{11}+h_{12})/2$, and each of $h_{11}$ and $h_{12}$ differs from $h_1$ by $(h_{12}-h_{11})/2$. When the modulation thicknesses corresponding to the wavelengths $\lambda_1$ and $\lambda_2$ are selected from the equivalent thicknesses $h_{11}'=(h_{11}+m \Delta h_{11})$, $h_{12}'=(h_{12}+n \Delta h_{12})$, $m,n=0,1,2,3, \ldots$, the final design modulation thickness similarly may be $h_1'=(h_{11}+m \Delta h_{11}+h_{12}+n \Delta h_{12})/2$, and each of $h_{11}'$ and $h_{12}'$ differs from $h_1'$ by $|h_{12}-h_{11}-m \Delta h_{11}+n \Delta h_{12}|/2$. In some situations, such difference will be smaller than the previous $(h_{12}-h_{11})/2$, which indicates that the selected design modulation thickness $h_1'$ is closer to the modulation thicknesses $h_{11}'$ and $h_{12}'$ for the wavelengths $\lambda_1$ and $\lambda_2$, so $h_1'$ is more desirable than $h_1$. This also applies to the situation in which the incident light beam contains more wavelength components.

Therefore, in the present invention, the modulation thickness $h_{1\alpha}'$ for the wavelength $\lambda_\alpha$ at a certain sampling point may be chosen from the series of alternative values shown in formula (8), and it may be expected to obtain the final design modulation thickness at the sampling point by a suitable modulation thickness selected from these alternative values. This may be called "thickness optimization algorithm" in the present invention.

Figure 2:
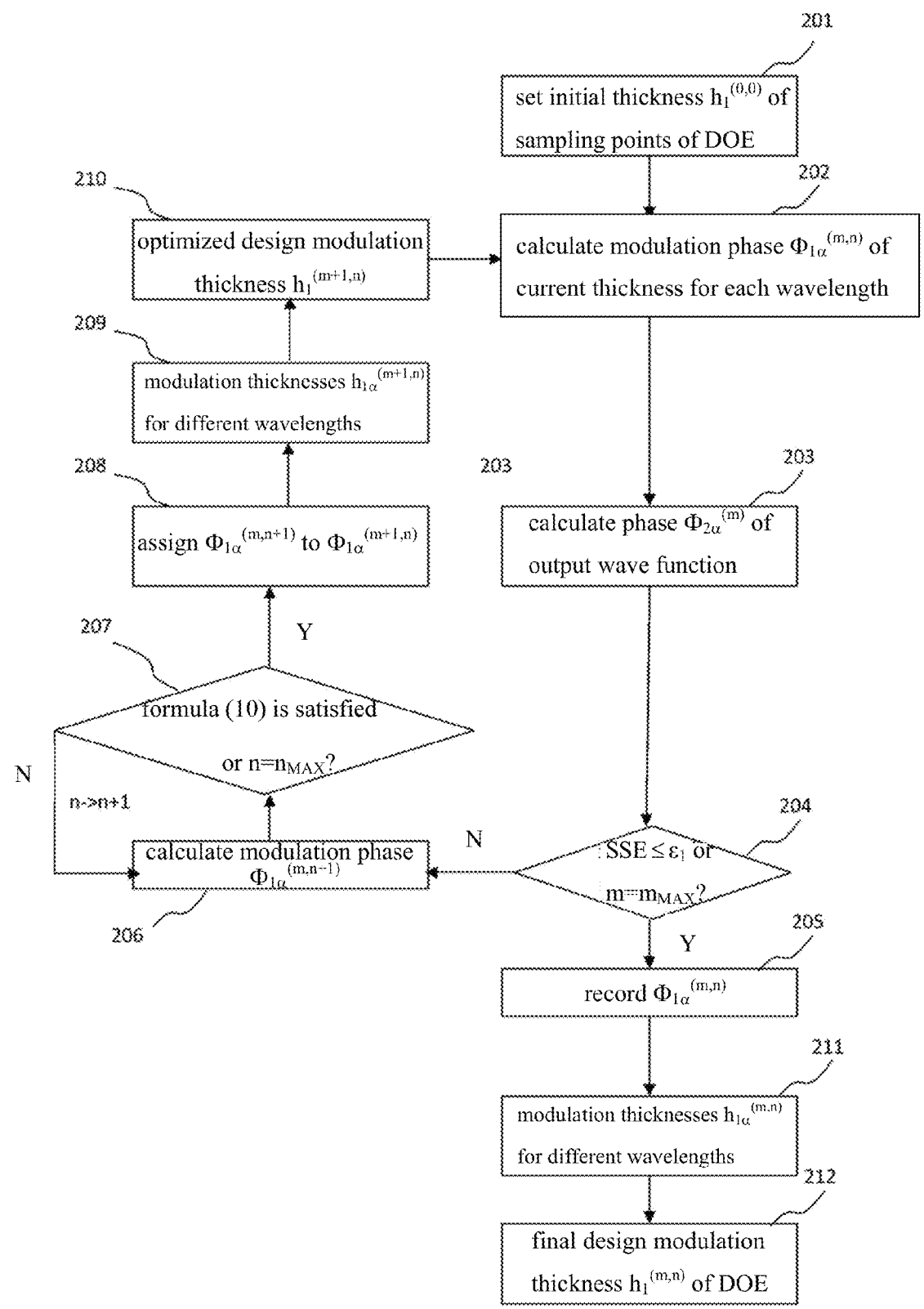
FIG. 2 illustrates an algorithm diagram for calculating design modulation thickness of the diffractive optical element based on Yang-Gu algorithm, wherein a thickness optimization algorithm according to the present invention is used.

Specific Examples of Design Method of Diffractive Optical Element According to the Present Invention FIG. 2 illustrates a specific example of iteration calculation for calculating the modulation thickness of the diffractive optical element according to the present invention.

As shown in FIG. 2, in step 201, an initial value is assigned to the design modulation thickness at each of the sampling points on the diffractive optical element. To facilitate the description of the iteration procedure, $h_1^{(m,n)}$ is used to identify the design modulation thickness at a certain sampling point, wherein the superscripts (m,n) respectively represent the numbers or tags of iterations of outer loop and inner loop during iteration operation, which will be clear in the following description. When the diffractive optical element is set with $N_1$ number of sampling points, each of the $N_1$ sampling points shall be set with an respective initial thickness $h_1^{(0,0)}$ for the design modulation thickness $h_1$.

In step 202, a modulation phase $\Phi_{1\alpha}^{(m,n)}$ corresponding to the current design modulation thickness $h_1^{(m,n)}$ or each of the different wavelengths $\lambda_\alpha$ is obtained according to the formula (7), wherein $\alpha=1, 2, 3, \ldots, N_\lambda$, and $N_\lambda$ represents the number of different wavelengths.

In step 203, a phase $\Phi_{2\alpha}^{(m)}$ at each of sampling points on the output plane is obtained for each of the different wavelengths $\lambda_\alpha$ according to the formula (5).

In step 204, a decision is made as to whether the condition shown in formula (9) is satisfied according to the current $\Phi_{1\alpha}^{(m,n)}$ or whether the number m of the outer loop iterations reaches a preset maximum $m_{MAX}$, $$SSE \leq \varepsilon_1 \qquad (9)$$

$$\text{wherein, } SSE = \sum_j \left( \|\hat{G}_\alpha \rho_{1\alpha} \exp[i\Phi_{1\alpha}^{(m,n)}]\| - \rho_{2\alpha}^0 \right)^2,$$

$\varepsilon_1$ is a preset small value, "$\| \|$" represents solving the modulus of a complex number, j indicates different sampling points on the diffractive optical element, and the summation symbol represents summating for all sampling points j from 1 to $N_1$.

If the formula (9) is satisfied or the number m of the outer loop iterations reaches the preset maximum $m_{MAX}$, the flow proceeds to step 205, otherwise proceeds to step 206.

In step 206, a next iteration value $\Phi_{1\alpha}^{(m,n+1)}$ is calculated by the formula (6) according to the current $\Phi_{1\alpha}^{(m,n)}$ and $\Phi_{2\alpha}^{(m)}$. It should be noted that the value of the modulation phase $\Phi_{1\alpha}^{(m,n+1)}$ here is in a range of $0 \leq \Phi_{1\alpha} < 2\pi$.

In step 207, a decision is made as to whether the condition shown in formula (10) is satisfied according to the current $\Phi_{1\alpha}^{(m,n+1)}$ and $\Phi_{1\alpha}^{(m,n)}$ or whether the number n of the inner loop iterations reaches a preset maximum $n_{MAX}$, $$\sum_j [\Phi_{1\alpha}^{(m,n+1)} - \Phi_{1\alpha}^{(m,n)}] \leq \varepsilon_2 \quad (10)$$

wherein j indicates different sampling points on the diffractive optical element, the summation symbol represents summating for all sampling points j from 1 to $N_1$, and $\varepsilon_2$ is a preset small value.

When the formula (10) is satisfied or the number n of the inner loop iterations reaches the preset maximum $m_{MAX}$, the flow proceeds to step 208. Otherwise, the flow returns to step 206 in which the next iteration value of $\Phi_{1\alpha}$ is calculated iteratively again according to the current $\Phi_{1\alpha}^{(m,n+1)}$ and $\Phi_{2\alpha}^{(m)}$ until the formula (10) in step 207 is satisfied or the number n of the inner loop iterations reaches the preset maximum $n_{MAX}$.

Step 206 and step 207 constitute the inner loop of the aforesaid iteration operation.

In step 208, the value of the current $\Phi_{1\alpha}^{(m,n+1)}$ is assigned to $\Phi_{1\alpha}^{(m+1,n)}$, and then the iteration tag n of the inner loop may be reset to zero.

In step 209, the modulation thickness $h_{1\alpha}^{(m+1,n)}$ corresponding to the modulation phase $\Phi_{1\alpha}^{(m+1,n)}$ for the wavelength $\lambda_\alpha$ is obtained by the formula (7), wherein $\alpha=1, 2, 3, \ldots, N_\lambda$, and $N_\lambda$ represents the number of different wavelengths. Noticeably, as the value of $\Phi_{1\alpha}$ is in a range of $0 \leq \Phi_{1\alpha} 2\pi$, the range of the modulation phase $\Phi_{1\alpha}^{(m+1,n)}$ corresponding to the modulation thickness $h_{1\alpha}^{(m+1,n)}$ is the same as that of $\Phi_{1\alpha}$.

In step 210, an optimized design modulation thickness $h_1^{(m+1,n)}$ is obtained by the thickness optimization algorithm according to the modulation thicknesses $h_{1\alpha}^{(m+1,n)}$ for respective wavelengths obtained in step 209.

Then, step 202 is performed using the current design modulation thickness $h_1^{(m+1,n)}$, to start the iteration procedure of a new outer loop until the formula (9) in step 204 is satisfied or the number m of the outer loop iterations reaches the preset maximum $m_{MAX}$, and then the flow proceeds to step 205.

In step 205, recorded is the phase $\Phi_{1\alpha}^{(m,n)}$ obtained when the formula (9) in step 204 is satisfied or the number m of the outer loop iterations reaches the preset maximum $m_{MAX}$.

In step 211, the modulation thickness $h_{1\alpha}^{(m,n)}$ corresponding to the phase $\Phi_{1\alpha}^{(m,n)}$ is obtained by the formula (7), wherein $\alpha=1, 2, 3, \ldots, N_\lambda$, and $N_\lambda$ represents the number of different wavelengths. Similar to step 209, the modulation phase corresponding to the modulation thickness $h_{1\alpha}^{(m,n)}$ is in a range of $0 \leq \Phi_{1\alpha} < 2\pi$.

In step 212, a final design modulation thickness $h_1^{(m,n)}$ is obtained by the thickness optimization algorithm according to the modulation thicknesses $h_{1\alpha}^{(m,n)}$ for respective wavelengths obtained in step 211.

Figure 3:
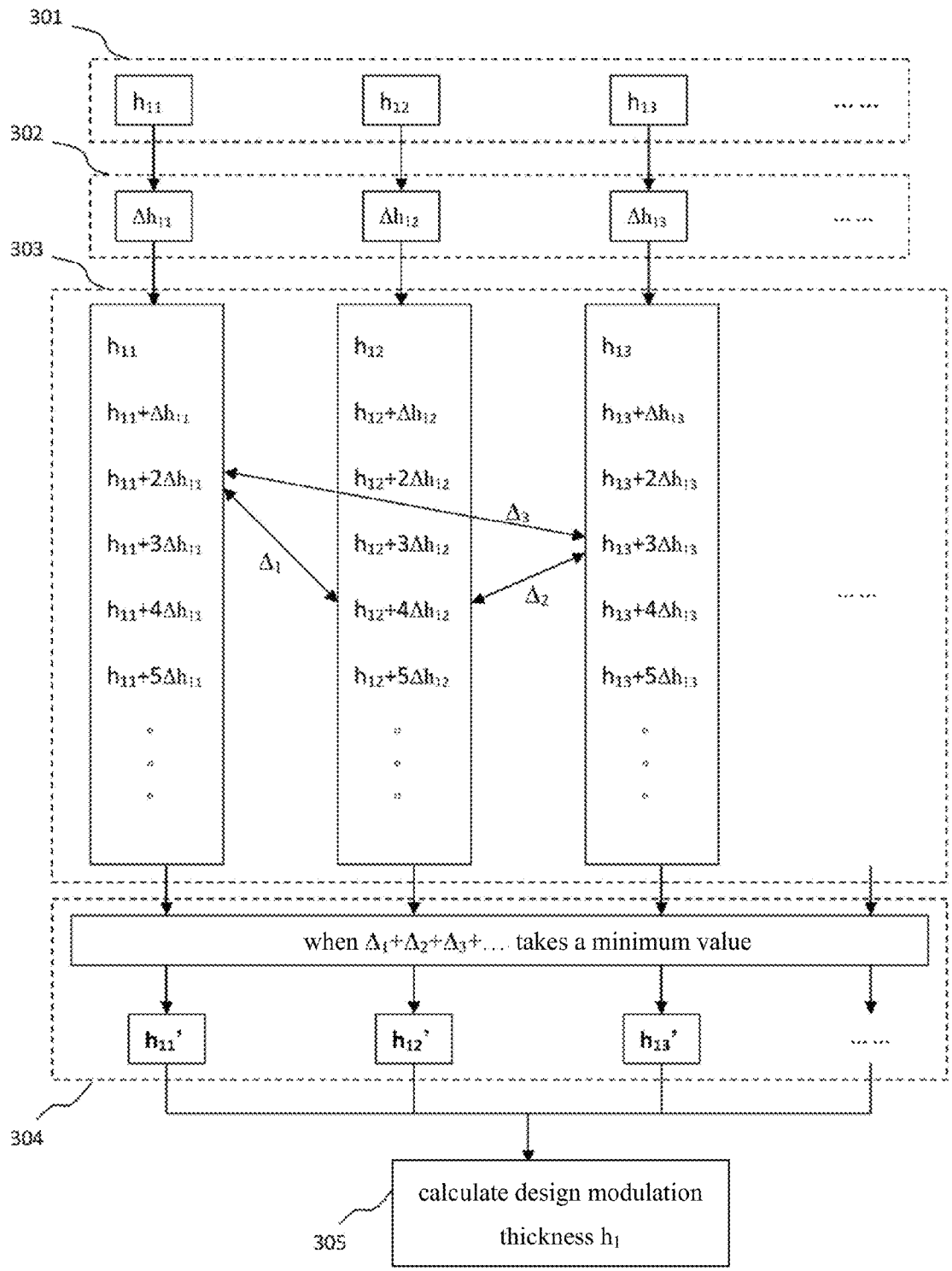
FIG. 3 illustrates an illustrative flow chart of the thickness optimization algorithm according to the present invention.

Specific Description of Thickness Optimization Algorithm According to the Present Invention In step 301 shown in FIG. 3, a plurality of modulation thicknesses $h_{1\alpha}$ corresponding to different wavelengths $\lambda_\alpha$ are obtained for a same sampling point of the diffractive optical element, wherein $\alpha=1, 2, 3, \ldots, N_\lambda$, wherein $N_\lambda$ represents the number of different wavelengths.

As far as Yang-Gu algorithm shown in FIG. 2 is concerned, these modulation thicknesses $h_{1\alpha}$ may correspond to the modulation thickness $h_{1\alpha}^{(m+1,n)}$ obtained in a certain iteration in step 209, and may also correspond to the modulation thickness $h_{1\alpha}^{(m,n)}$ obtained in step 211. As stated previously, at present the modulation phase $\Phi_{1\alpha}$ corresponding to the modulation thickness $h_{1\alpha}$ is in a range of $0 \leq \Phi_{1\alpha} < 2\pi$.

In step 302, a respective thickness change $\Delta h_{1\alpha} = \lambda_\alpha / (n_\alpha - 1)$ may be obtained corresponding to each of the different wavelengths $\lambda_\alpha$, and the amount of phase modulation corresponding to such a thickness change is $2\pi$ as known from the relationship between the modulation phase and the modulation thickness described in the formula (7).

In step 303, a plurality of thicknesses expressed by $h_{1\alpha}' = h_{1\alpha} + K\Delta h_{1\alpha} (K=0,1,2,3,\ldots)$ are all regarded as alternative modulation thicknesses for the wavelength $\lambda_\alpha$. Although K theoretically may take any non-negative integer, the alternative modulation thicknesses $h_{1\alpha}'$ impossibly take too large values due to limitations of the level of the actual fabricating process of diffractive optical element. For example, if the desired diffractive optical element is fabricated by photolithography process, the maximum etching depth of the photolithography process may limit the range of the modulation thicknesses.

In step 304, a modulation thickness for each wavelength $\lambda_\alpha$ is selected from the corresponding plurality of alternative modulation thicknesses $h_{1\alpha}'$ to participate in calculation of the design modulation thickness $h_1$ of step 305. A criterion for the selecting is that the selected $N_\lambda$ modulation thicknesses are concentrated in a range as small as possible, in other words the differences therebetween are as small as possible. If the final design modulation thickness $h_1$ is regarded as an ideal value and the selected modulation thicknesses corresponding to different wavelengths are regarded as measurements, the criterion for "selecting" may be expressed as how to make the selected $N_\lambda$ modulation thicknesses have a minimum error as compared with the design modulation thickness $h_1$ calculated from the selected $N_\lambda$ modulation thicknesses, and an error function may be used as an evaluation criterion in this regard.

On one embodiment, a thickness distance between any two respective alternative modulation thicknesses corresponding to any two different $\lambda_\alpha$ and $\lambda_\beta$ may be defined as $\Delta_{\alpha\beta JK} = |(h_{1\alpha} + K\Delta h_{1\alpha}) - (h_{1\beta} + J\Delta h_{1\beta})|$, and the selected ones from the alternative modulation thicknesses of $\lambda_\alpha$ and $\lambda_\beta$ are determined according to K and J taken when $$\sum_{\alpha\beta KJ} \Delta_{\alpha\beta KJ}$$

is minimized. In another embodiment, the selected ones from the alternative modulation thicknesses of $\lambda_\alpha$ and $\lambda_\beta$ are determined according to K and J taken when the variance $$\sum_{\alpha\beta KJ} \Delta^2_{\alpha\beta KJ}$$

is minimized. In other embodiments, an error function in other forms may also be chosen as the evaluation criterion to determine which alternative modulation thickness shall be selected.

In FIG. 3, $\Delta_1$ is used to express the distance between any two respective alternative modulation thicknesses corresponding to wavelengths $\lambda_1$ and $\lambda_2$, $\Delta_2$ is used to express the distance between any two respective alternative modulation thicknesses corresponding to wavelengths $\lambda_2$ and $\lambda_3$, $\Delta_3$ is used to express the distance of any two respective alternative modulation thicknesses corresponding to wavelengths $\lambda_1$ and $\lambda_3$, . . . . As such, according to the aforesaid embodiment, when $(\Delta_1+\Delta_2+\Delta_3+ \ldots)$ takes a minimum value, a group of modulation thicknesses $h_{11}'$, $h_{12}'$, $h_{13}'$, . . . may be selected. Similarly, when $(\Delta_1^2+\Delta_2^2+\Delta_3^2+ \ldots)$ takes a minimum value, a group of modulation thicknesses may be selected.

In step 305, one design modulation thickness $h_1$ representative of the thickness of the diffractive optical element is calculated according to the group of modulation thicknesses as selected in step 304. The design modulation thickness $h_1$ may be an average value or intermediate value of the selected group of modulation thicknesses, or may be obtained by other criteria (e.g., minimum variance).

Steps 301-305 of the thickness optimization algorithm are performed for each sampling point of the diffractive optical element, and then the design modulation thicknesses $h_1$ of all sampling point may be determined. As stated above, an intermediate iteration value of the design modulation thickness of a current sampling point may be obtained when the thickness optimization algorithm is applied to step 209 and step 210 of FIG. 2; and the final design modulation thickness of the current sampling point may be obtained when the thickness optimization algorithm is applied to step 211 and step 212 of FIG. 2.

When the diffractive optical element is designed according to the design modulation thickness obtained by the thickness optimization algorithm of the present invention, it is possible for the finally designed diffractive optical element that the design modulation thickness at at least one sampling point is configured to modulate the phase of all of the plurality of wavelength components with a modulation amount of greater than $2\pi$, i.e., the design modulation thickness at this sampling point $h_1 > \lambda_\alpha/(n_\alpha-1)$, wherein $\alpha$ is any one of 1 to $N_\lambda$. This is obviously different from the diffractive optical element designed according to the existing methods.

It should be appreciated that in other variant embodiments of the method shown in FIG. 2, the thickness optimization algorithm may not be employed in the iteration procedure, but used only once after completion of iterations; or the thickness optimization algorithm of the present invention may be used only in the iteration procedure.

Besides, the thickness optimization algorithm according to the present invention may not be limited to Yang-Gu algorithm, and may apply to any algorithm that constrains the modulation phase to less than $2\pi$.

Application of Diffractive Optical Element of the Present Invention to Solar Cell In the case that the diffractive optical element designed by the method according to the present invention performs color separation and focusing as shown in FIG. 1, theoretical analysis and testing of focusing performance are performed for the designed diffractive optical element at a visible light wave band, and its theoretical diffractive efficiency exceeds 79%. Therefore, this allows for an important prospect of applying such diffractive optical element to a system such as a highly efficient solar cell.

Figure 4:
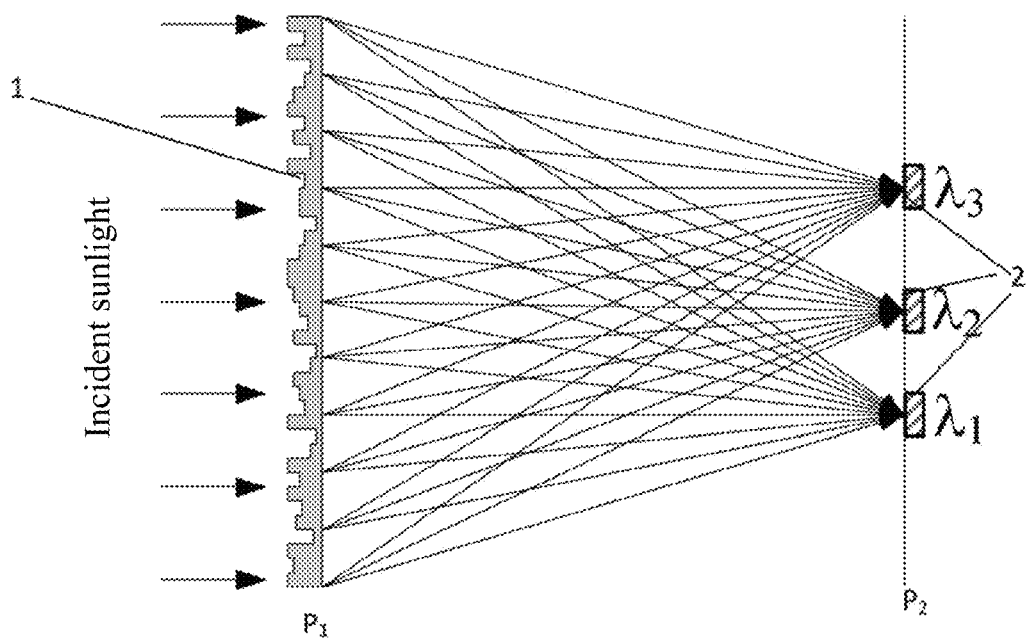
FIG. 4 illustrates a simplified illustrative view of a solar cell.

FIG. 4 exemplarily illustrates a structural schematic view of a solar cell. The solar cell comprises a single diffractive optical element 1 for color-separating a plurality of selected wavelength components ($\lambda_\alpha$, $\alpha=1\sim N_\lambda$, $N_\lambda=3$ in FIG. 4) of the incident sunlight and then focusing them onto an output plane $P_2$. A respective plurality of kinds of semiconductor materials 2 (three kinds are shown in FIG. 4) are provided at respective focusing areas of the corresponding wavelength components on the output plane $P_2$, and respectively used to absorb the sunlight having corresponding wavelengths.

Since the diffractive optical element designed according to the present invention substantially improves the diffraction efficiency, more solar energy can be utilized so that the color-separating and focusing diffractive optical element has practical application significance in solar cells.

The above only describes preferred embodiments of the present invention and is not intended to limit the present invention. Those skilled in the art may appreciate that the present invention may have various alterations and variations. Any modifications, equivalent substitutes and improvements within the spirit and principles of the present invention all fall within the scope of the present invention.

What is claimed is:

1. A method of making a diffractive optical element by a photolithography process, wherein said diffractive optical element is configured to color-separate and focus a plurality of selected wavelength components of an incident sunlight beam on an output plane and wherein said diffractive optical element is designed by a method comprising:

obtaining design modulation thicknesses at a plurality of sampling points of the diffractive optical element, the diffractive optical element being disposed at an input plane of an optical system and configured to modulate phase of an incident light beam having a plurality of wavelength components so as to obtain a desired optical distribution on an output plane;

and, for each sampling point of the diffractive optical element:

Step 1: calculating a modulation thickness for each wavelength component at a current sampling point of the diffractive optical element, and accordingly obtaining a respective plurality of modulation thicknesses corresponding to the plurality of wavelength components;

Step 2: obtaining a series of mutually-equivalent alternative modulation thicknesses for each modulation thickness, the series of mutually-equivalent alternative modulation thicknesses being corresponding to a respective series of modulation phases mutually different by an integer multiple of $2\pi$;

Step 3: selecting a modulation thickness from the alternative modulation thicknesses of each wavelength component, and determining a design modulation thickness of the current sampling point based on a respective plurality of selected modulation thicknesses corresponding to the plurality of wavelength components; and designing the diffractive optical element by the design modulation thickness representing the thickness of the diffractive optical element at the current sampling point.

2. The method of claim 1, wherein in Step 1 the modulation thickness is calculated by using Yang-Gu algorithm.

3. The method of claim 2, wherein the Yang-Gu algorithm comprises an iterative cycle consisting of multiple iterations, and the modulation thickness in the current iteration is obtained during each iteration.

4. The method of claim 3, wherein Step 2 and Step 3 are performed for the modulation thickness obtained in the current iteration.

5. The method of claim 3, wherein a final modulation thickness is obtained at the end of the iterative cycle of the Yang-Gu algorithm, and then Step 2 and Step 3 are performed for the final modulation thickness.

6. The method of claim 1, wherein a modulation phase corresponding to the modulation thickness in Step 1 is less than $2\pi$.

7. The method of claim 1, wherein in Step 2 a maximum value of the alternative modulation thicknesses is constrained according to a limitation of the photolithography process for making the diffractive optical element.

8. The method of claim 7, wherein the limitation is a maximum etching depth of the photolithography process.

9. The method of claim 1, wherein in Step 3 a criterion for the selecting is to make the differences between the plurality of selected modulation thicknesses as small as possible, or to make the plurality of selected modulation thicknesses have a minimum error as compared with the design modulation thickness determined by the plurality of selected modulation thicknesses.

10. The method of claim 1, wherein the desired optical distribution comprises an optical distribution of color-separating and focusing the wavelength components of the incident light beam on the output plane.

11. The method of claim 1, wherein the design modulation thickness of at least one sampling point of the diffractive optical element enables the sampling point to modulate the phase of each wavelength component of the plurality of wavelength components with a modulation amount of greater than $2\pi$.

12. The method of claim 11, wherein the desired optical distribution comprises an optical distribution of color-separating and focusing the wavelength components of the incident light beam on the output plane.

* * * * *